United States Patent
Höft et al.

(10) Patent No.: US 11,538,943 B2
(45) Date of Patent: Dec. 27, 2022

(54) PHOTOVOLTAIC SYSTEM, DIRECT CURRENT HYBRID SWITCHING DEVICE, USE AND METHOD FOR SWITCHING A PHOTOVOLTAIC STRING ON AND OFF

(71) Applicant: Phoenix Contact GmbH & Co. KG, Blomberg (DE)

(72) Inventors: Wolfgang Höft, Barntrup (DE); Andreas Stefan Ende, Emmerthal (DE)

(73) Assignee: Phoenix Contact GmbH & Co. KG, Blomberg (DE)

( * ) Notice: Subject to any disclaimer, the term of this patent is extended or adjusted under 35 U.S.C. 154(b) by 305 days.

(21) Appl. No.: 16/332,069

(22) PCT Filed: Sep. 8, 2017

(86) PCT No.: PCT/EP2017/072568
§ 371 (c)(1),
(2) Date: Mar. 11, 2019

(87) PCT Pub. No.: WO2018/046653
PCT Pub. Date: Mar. 15, 2018

(65) Prior Publication Data
US 2019/0363200 A1    Nov. 28, 2019

(30) Foreign Application Priority Data

Sep. 12, 2016  (LU) ............................................ 93202
Apr. 11, 2017  (BE) .................................... 2017/5252
(Continued)

(51) Int. Cl.
*H01L 31/02*    (2006.01)
*H02S 50/10*    (2014.01)
*H02S 40/30*    (2014.01)

(52) U.S. Cl.
CPC ........ *H01L 31/02021* (2013.01); *H02S 40/30* (2014.12); *H02S 50/10* (2014.12)

(58) Field of Classification Search
CPC ... H01L 31/02021; H02S 40/30; H02S 50/10; H02S 50/00; H02S 40/36; H02J 3/383; Y02E 10/56
See application file for complete search history.

(56) References Cited

U.S. PATENT DOCUMENTS 6,643,112 B1 * 11/2003 Carton .................... H01H 9/54
218/3
2009/0097172 A1 * 4/2009 Bremicker ........... H01H 33/596
361/8

(Continued)

FOREIGN PATENT DOCUMENTS

CN    104904114 A    9/2015
DE    10312921 A1    10/2004
(Continued)

OTHER PUBLICATIONS

English Translation of International Preliminary Report on Patentability, Int. Serial No. PCT/EP2017/072568, Int. Filing Date: Sep. 8, 2017, Applicant: Phoenix Contact GmbH & Co. KG, dated Mar. 21, 2019.

(Continued)

*Primary Examiner* — Daniel Cavallari
(74) *Attorney, Agent, or Firm* — Reising Ethington P.C.

(57) ABSTRACT

The present disclosure relates to a photovoltaic system comprising a switching device for switching on and off at least one photovoltaic string, to an electronically controlled direct current hybrid switching device for switching on and off at least one photovoltaic string, in a user-controlled manner, to the use of a hybrid switch for switching a photovoltaic string, and to a method for switching off and (Continued)

back on at least one photovoltaic string of the photovoltaic system. The photovoltaic system comprises:
- at least one photovoltaic string, wherein the at least one photovoltaic string is formed by photovoltaic modules which are series-connected by means of a string line and thus generate a string voltage;
- a switching device which is installed in series in the string line to switch on and off the at least one photovoltaic string with the switching device,
- wherein the switching device comprises a hybrid switch with a relay and a semiconductor switching device which is connected in parallel to the relay and has at least one semiconductor switch.

20 Claims, 6 Drawing Sheets

(30) Foreign Application Priority Data

| Apr. 11, 2017 | (BE) | .................................... | 2017/5253 |
| Apr. 21, 2017 | (BE) | .................................... | 2017/5277 |

(56) References Cited

U.S. PATENT DOCUMENTS

| 2009/0097717 | A1 | 4/2009 | Bremicker et al. | |
| 2011/0073150 | A1 | 3/2011 | Hightower et al. | |
| 2011/0301772 | A1 | 12/2011 | Zuercher et al. | |
| 2012/0007657 | A1 | 1/2012 | Naumann et al. | |
| 2012/0053867 | A1* | 3/2012 | Dunn | H02S 50/10 |
| | | | | 702/58 |
| 2013/0285670 | A1 | 10/2013 | Yoshidomi et al. | |
| 2014/0266288 | A1 | 9/2014 | Trabacchin et al. | |
| 2015/0171789 | A1 | 6/2015 | Har-Shai et al. | |
| 2015/0194801 | A1 | 7/2015 | Schripsema | |
| 2015/0288331 | A1* | 10/2015 | Strobl | H02H 7/20 |
| | | | | 324/761.01 |
| 2015/0349709 | A1 | 12/2015 | Ponec et al. | |
| 2016/0091554 | A1 | 3/2016 | Fornage et al. | |

FOREIGN PATENT DOCUMENTS

| DE | 202009004198 | U1 | 9/2010 |
| DE | 102011113798 | A1 | 5/2012 |
| DE | 102011079074 | A1 | 1/2013 |
| DE | 102011110682 | A1 | 2/2013 |
| DE | 102012024728 | A1 | 7/2014 |
| DE | 102013101314 | A1 | 8/2014 |
| DE | 102016117049 | A1 | 3/2018 |
| EP | 2284908 | A1 | 2/2011 |
| EP | 2523225 | A1 | 11/2012 |
| EP | 2648009 | A1 | 10/2013 |
| EP | 3041104 | A1 | 7/2016 |
| WO | 2014094929 | A1 | 6/2014 |
| WO | 2016091281 | A1 | 6/2016 |

OTHER PUBLICATIONS

NPL 1, Search Report and Written Opinion of the European Search Authority, Reference: NP-SEND-SR-93202, Applicant Phoenix Contact GmbH & Co. KG, dated May 11, 2017.

NPL 2, Search Report and Written Opinion of the European Search Authority, Reference: BE2017/5253, Applicant Phoenix Contact GmbH & Co. KG, dated Jul. 7, 2017.

NPL 3, International Search Report and Written Opinion of ISA, Int. Serial No. PCT/EP2017/072566, Int Filing Date Sep. 8, 2017, Applicant: Phoenix Contact GmbH & Co. KG, dated Oct. 30, 2017.

NPL 4, Search Report and Written Opinion of the European Search Authority, Reference: BE2017/5252, Applicant Phoenix Contact GmbH & Co. KG, dated Jul. 1, 2017.

NPL 5, International Search Report and Written Opinion of the ISA, Int. Serial No. PCT/EP2017/072568, Int. Filing Date: Sep. 8, 2017, Applicant: Phoenix Contact GmbH & Co. KG, dated Nov. 21, 2017.

NPL 6, Search Report and Written Opinion of the European Search Authority, Reference: BE2017/5277, Applicant Phoenix Contact GmbH & Co KG, dated Jun. 30, 2017.

NPL 7, International Search Report and Written Opinion of the ISA, Int. Serial No. PCT/EP2017/072569, Int. Filing Date: Sep. 8, 2017, Applicant: Phoenix Contace GmbH & Co KG, dated Nov. 20, 2017.

German Office Action, Serial No. 10 2016 117 049.6, Applicant: Phoenix Contact GmbH & Co. KG, dated Apr. 18, 2017.

German Office Action, Serial No. 10 2017 108 507.6, Applicant: Phoenix Contact GmbH & Co. KG, dated Apr. 19, 2018.

German Office Action, File No. 102017107800.2, Applicant: Phoenix Contact GmbH & Co. KG, Blumbach Ref 16PH0346DEP, dated Mar. 16, 2021.

German Office Action, File No. 112017003473.6, Applicant: Phoenix Contact GmbH & Co. KG, Blumbach Ref: 16PH0439DEP(WO), dated Mar. 16, 2021.

German Office Action, File No. 112017004573.8, Applicant: Phoenix Contact GmbH & Co. KG, Blumbach Ref: 16PH0346DEP(WO), dated Mar. 16, 2021.

German Office Action, File No. 102017107801.0, Applicant: Phoenix Contact GmbH & Co. KG, Blumbach Ref: 16PH0439DEP, dated Mar. 16, 2021.

Chinese Office Action, Application No. 201780055784.X, Applicant: Phoenix Contact GmbH & Co. KG, dated Nov. 3, 2021.

\* cited by examiner

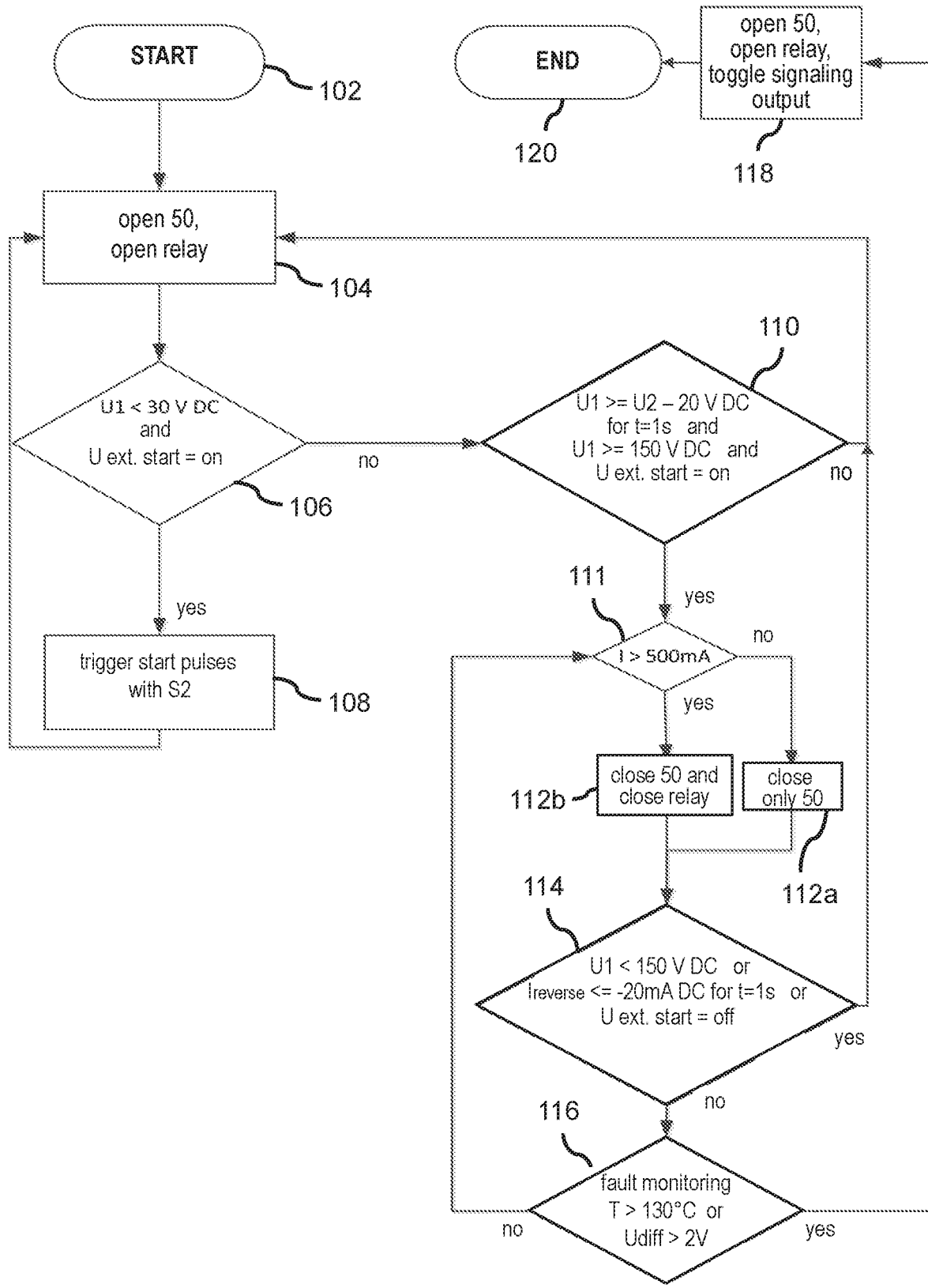

PHOTOVOLTAIC SYSTEM, DIRECT CURRENT HYBRID SWITCHING DEVICE, USE AND METHOD FOR SWITCHING A PHOTOVOLTAIC STRING ON AND OFF

TECHNICAL FIELD

The present disclosure relates to a photovoltaic system comprising a switching device for switching on and off at least one photovoltaic string, to an electronically controlled direct current hybrid switching device for switching on and off at least one photovoltaic string in a user-controlled manner, to the use of a hybrid switch for switching a photovoltaic string, and to a method for switching off and back on at least one photovoltaic string of the photovoltaic system.

BACKGROUND

A photovoltaic system typically comprises a multitude of photovoltaic modules that are series-connected to form strings in order to achieve a nominal photovoltaic generator DC voltage of currently typically up to 1000 volts or even 1500 volts. Furthermore, depending on the number of interconnected photovoltaic modules and their individual voltage, a plurality of the photovoltaic strings in turn are optionally connected in parallel, and each photovoltaic string can generate a nominal current of 10 A, for example. When a plurality of strings are connected in parallel, this is also referred to as a multi-string interconnection.

Due to the high voltage and the high currents in the DC part of the photovoltaic system, there is a risk that people might be exposed to life-threatening voltages during maintenance or incidents, for example in the event of a fire.

Therefore, photovoltaic module protective circuits have been developed which allow to individually switch off the photovoltaic modules (cf. WO2013/026539 A1 and Applicant's product SCK-RSD-100). Furthermore, starting boxes have been developed, which allow to re-enable such "smart" photovoltaic modules (cf. WO2014/122325 A1 and Applicant's products SCK-RSD-400 and SCK-RSD-600).

Furthermore, DE 10 2016 117 049 (not prepublished) describes a reverse current protective circuit which allows to separate a string from the central collection point in order to prevent cross currents. The function of DE 10 2016 117 049 is to automatically prevent current flow out of the further photovoltaic strings against the flow direction of the current photovoltaically generated in the respective string (cross current or reverse current) by means of the reverse current protective circuit.

A German patent application of the present Applicant, filed on the same date as the present application, describes a string switch-off device for switching off a single string in a multi-string photovoltaic system.

The present disclosure is based thereon, and therefore the disclosure content of DE 10 2016 117 049 and of the patent application filed on the same day as the present application are hereby incorporated by reference.

For example, a suitable DC isolator is required for electrically disconnecting a photovoltaic string from an array of parallel connected strings in a multi-string photovoltaic system.

Although a photovoltaic system typically has a DC main circuit breaker in the so-called generator junction box, however, in the case of damage caused on the solar panels or on the connection lines by fire, water, hail etc., for example, it is not able to disconnect the section upstream of the generator junction box. Furthermore, such DC main circuit breakers in the generator junction box are typically manually operated, so that higher-level remote control is typically not possible. Additionally, such manually operated DC main circuit breakers are large in terms of installation size and expensive. Also, motorized emergency switches are known, but they are large in size and expensive as well. Moreover, selective disconnection of individual photovoltaic strings is not possible at all with such switches.

Nevertheless, switching operations within a photovoltaic generator typically involve switching of a combination of high DC string voltage and high DC string current. In contrast to an AC application and due to the lack of zero crossings, a non-extinguishing arc may arise when switching a high DC voltage and a high DC current. With a common AC voltage frequency, an arc would typically extinguish by itself after 10 ms at the latest.

From WO 2016/091281 A1, a device is known comprising a switching device for switching an AC voltage or an AC current, which has a bridging means for bridging the switching device in an operating phase. However, this device is described exclusively for alternating voltage or alternating current.

General Description

The present disclosure is based, inter alia, on the finding that the switching device presently disclosed allows to partially or completely switch on and off or electrically disconnect and reconnect photovoltaic generators in the direct current (DC) part in a safe manner and with low power dissipation.

An aspect of the present disclosure provides a photovoltaic system comprising a switching device for switching on and off at least one photovoltaic string, and the switching device should be cost-effective, reliable and durable under the DC string voltages and DC string currents typical in photovoltaic systems, and should exhibit low power dissipation and allow to be installed in a small space.

Another aspect of the present disclosure is to provide a photovoltaic system with a switching device for switching on and off at least one photovoltaic string, which meets high safety requirements, is easy to maintain and repair and is comfortable to operate by the user.

A further aspect of the present disclosure is to provide a method for switching on and off at least one photovoltaic string of a photovoltaic system, which offers high safety and flexibility, e.g. during maintenance, and is comfortable to operate by the user.

Another aspect of the present disclosure is to provide an electronically controlled DC hybrid switching device for performing switching operations in the DC part of a photovoltaic system, which is cost-effective, reliable and durable under the string voltages and string currents typical in photovoltaic systems, and which at the same time exhibits low power dissipation and can be installed in a small space, and which can optionally be retrofitted in any existing photovoltaic systems.

Various aspects of the present disclosure are achieved by the subject matter provided in the independent claims. Other embodiments of the present disclosure are defined in the dependent claims.

The present disclosure relates to a photovoltaic system comprising at least one string or photovoltaic string, which is formed by a plurality of photovoltaic modules that are series-connected by means of a string line in order to produce the desired string voltage and to supply photovoltaically generated electrical power of the desired string voltage and desired string current to a current collector, e.g. an inverter (sometimes referred to as a solar inverter). However, the photovoltaic system may also be used without an inverter, for example it may be connected to a charging unit as a current collector. Currently, string voltages of up to 1000 V DC are possible according to protection class II. A further increase to up to 1500 V DC, which is the limit of the definition of low voltage according to VDE0100, is being worked on. Therefore, in the context of the present disclosure it is intended to switch DC string voltages which amount to a multiple of the voltage of a single photovoltaic module.

The photovoltaic system comprises a switching device which is connected in series in the string line to switch on and off the at least one photovoltaic string by the switching device, i.e. to electrically disconnect the at least one photovoltaic string from the current collector, e.g. from a central collection point or from an inverter.

The switching device comprises a hybrid switch including a relay, in particular an electromechanical relay, and a semiconductor switching device connected in parallel to the relay, which in particular comprises at least one, preferably two semiconductor switches or transistors. As a result, switching operations requiring to switch the string voltage can be performed by the semiconductor switching device, and the relay relieves the semiconductor switching device from the string current when the relay is closed during continuous operation. In other words, on the one hand, when switching on and off, the relay is used to switch only the residual voltage remaining across the semiconductor switching device, and on the other hand, due to its low lead-through resistance, the relay almost completely commutes the string current generated by the at least one photovoltaic string.

So, more particularly, when the photovoltaic string is switched on, first the semiconductor switching device alone switches on the photovoltaic string, while the relay is open and initially remains open. After a certain time delay, and with the semiconductor switching device previously closed, the relay is also closed, so that the semiconductor switching device is relieved from the current flow by the later closed relay that is connected in parallel. Therefore, the relay only needs to switch a low voltage, and the semiconductor switching device does not need to carry the string current permanently, only for a short time. This allows to employ cost-effective standard semiconductor switches and standard relays, and power dissipation can still be kept low in continuous operation. Switching-off is performed in reverse order: first the relay is opened, with the semiconductor switching device still closed, and after a certain time delay the semiconductor switching device is opened, when the relay has already been opened before. In other words, after the opening of the relay, the at least one photovoltaic string is switched off by additionally opening the semiconductor switching device.

The switching device is installed in the DC part of the photovoltaic generator, preferably upstream of the central collection point, and switches on and off the at least one photovoltaic string there. However, the present disclosure is not limited to exactly one switching device switching exactly one photovoltaic string. It is also within the scope of the present disclosure that a plurality of photovoltaic strings that are connected in parallel are commonly switched by the same switching device, and also that the photovoltaic generator has only one photovoltaic string. Accordingly, more generally, the switching device switches a part of or the entire photovoltaic generator. However, the switching in particular is not effected at the module level with a low module voltage, rather a plurality of photovoltaic modules that are connected in series into a photovoltaic string are switched, which requires the high switching voltage. Accordingly, the switching device is connected between the plurality of series-connected photovoltaic modules and the current collector, e.g. the inverter, or between the plurality of series-connected photovoltaic modules and a generator junction box. The switching device is an electronic switching device and thus can be triggered externally. Therefore, the switching device or, if a plurality of switching devices are provided, the switching devices can be triggered remotely by the user, which is preferred compared to a conventional manually operated DC isolator in the generator junction box.

Preferably, despite the DC string voltages and DC string currents typical in photovoltaic systems, the switching device is cost-effective, reliable and durable, and exhibits low power dissipation. It can in particular be accommodated in a small installation space.

Thus, a photovoltaic system is provided which allows to switch on and off at least one photovoltaic string in a user-controlled manner and optionally in electronically triggered manner, which is comfortable, maintenance friendly and repair friendly, and ensures high safety standards.

The switching device is preferably installed in the string cabling. More particularly, the switching device is accommodated in a string box that covers multiple photovoltaic modules, i.e. at a higher level than module level, preferably in a (plastic) housing, and this string box is installed in the string cabling between the series-connected photovoltaic modules and the current collector. The string box may have plug-in connectors at its input and/or output for being removably installed in the string line and for retrofitting purposes. So, even retrofitting in existing photovoltaic systems is possible.

The switching device may be integrated in a string box, e.g. in a start box according to WO2014/122325 A1 which is hereby fully incorporated by reference.

The user can switch off the associated photovoltaic string on an external switch at the string box that covers multiple photovoltaic modules, or the user selectively sends a switch-off trigger signal from a central controller of the multi-string photovoltaic system to a single or to some individual or to all string boxes, and in response thereto the one or more associated switching device(s) will switch off the associated one or more photovoltaic string(s).

So, the user can selectively switch off or disconnect the current-carrying connections of the one or more desired photovoltaic string(s) from the central collection point or inverter, and can do this locally at the associated photovoltaic string, and/or centrally on the system side, but in particular on a higher than photovoltaic module level.

The switching device preferably switches either the positive pole conductor or the negative pole conductor and thereby interrupts the electrical circuit of the at least one photovoltaic string. Nevertheless, it may be preferred to install the string box into both conductors (positive pole and negative pole) of the string line, upstream and downstream of the first and last photovoltaic module, respectively, in the at least one photovoltaic string.

The relay and the semiconductor switching device are connected in parallel to each other, and the parallel circuit of relay and semiconductor switching device is connected in series into the photovoltaic string. Accordingly, the relay and the semiconductor switching device are each connected in series into the photovoltaic string, and in parallel to each other.

The photovoltaic system comprises a photovoltaic generator with one or more photovoltaic strings connected in parallel to each other. If a plurality of photovoltaic strings are connected in parallel, the switching device can be used to selectively switch on and off either one photovoltaic string or possibly also a plurality of or all photovoltaic strings, depending on which rated currents are supplied by the photovoltaic strings and for which current the switching device is adapted. That means, in the case of multiple photovoltaic strings, the switching device may be located upstream or downstream of the central collection point. The central collection point defines a point of parallel connection of a plurality of photovoltaic strings. However, if a plurality of parallel photovoltaic strings are provided (multi-string photovoltaic system), it is particularly preferable for the switching device to be arranged upstream of the central collection point.

In accordance with the present disclosure, firstly, each switching device then has to switch only the current of one photovoltaic string, and secondly, each photovoltaic string can be switched on and off individually. Thus, in a multi-string photovoltaic system, two or more photovoltaic strings are connected in parallel, and the photovoltaic strings are each formed by series-connected photovoltaic modules.

In other words, in the DC part of the photovoltaic system, the at least one photovoltaic string is disconnected from the current collector, e.g. the inverter, by opening the hybrid switch thereby interrupting the current flow from the at least one photovoltaic string to the current collector, and the at least one photovoltaic string is connected by closing the hybrid switch to electrically connect the at least one photovoltaic string to the current collector, so that current flow from the at least one photovoltaic string into the current collector is enabled.

In particular, the switching device defines a closed state and an open state, and in the closed state it passes photovoltaically generated current from the at least one photovoltaic string to a current collector, and in the open state it interrupts the transfer of photovoltaically generated current from the at least one photovoltaic string. Preferably, the system comprises a control device which is configured to open and/or close the switching device or the hybrid switch in a user-controlled manner in response to a user input. Thus, the user is able to selectively switch on and off the at least one photovoltaic string at any time, for example in the event of malfunctions or for maintenance work.

Preferably, the control device is adapted to receive an external user-generated string switch-off trigger signal and to be responsive to such string switch-off trigger signal by switching off the at least one photovoltaic string, wherefore the control means opens the switching device thereby disconnecting the at least one photovoltaic string from the current collector at least on one side. Accordingly, the switching device is in particular an actively switchable and/or electronically controlled switching device.

In a multi-string photovoltaic system, at least one of the parallel photovoltaic strings, preferably all of the parallel photovoltaic strings, have a switching device according to the present disclosure in their respective associated string line, in particular between the photovoltaic modules of this respective photovoltaic string and the central collection point, by means of which the current-carrying connection between this associated photovoltaic string and the central collection point can be selectively disconnected in a user-controlled manner, i.e. at the request of the user, in order to selectively and individually switch off the at least one photovoltaic string or any desired photovoltaic string from the parallel circuit. In other words, the switching device according to the present disclosure may also be used for disconnecting individual strings in a multi-string photovoltaic system. That is to say, a single or a plurality of individual photovoltaic strings can be selectively switched off, and the other photovoltaic strings of the parallel circuit remain in operation and may continue to feed photovoltaically generated power through the central collection point, in particular into the inverter. In this case, the user can thus selectively switch off one or more of the photovoltaic strings individually, and can disconnect the current-carrying connection of the photovoltaic strings to the central collection point as desired by the user, e.g. for maintenance purposes, repair or in the event of localized malfunction. Thus, entire photovoltaic strings can be switched off (and not just individual photovoltaic modules), and the current-carrying connection of one or more entire photovoltaic strings to the central collection point can be disconnected.

The at least one semiconductor switch or transistor is in particular a field effect transistor, preferably a MOSFET.

In accordance with the present disclosure, one embodiment provides the switching device or the hybrid switch configured to interrupt, in its open state, the current flow not only in one direction, but in both directions. This allows not only to achieve a safety shutdown, e.g. in the event of malfunctions or for maintenance purposes, i.e. an interruption of the flow of current photovoltaically generated by the associated photovoltaic string. It is also possible to interrupt currents in the opposite direction, i.e. cross currents or reverse currents, for example from other parallel-connected photovoltaic strings into the associated photovoltaic string. In accordance with the present disclosure, multi-string photovoltaic systems are provided, but are optional for the presently claimed disclosure.

This can be achieved, for example, when the hybrid switch comprises two semiconductor switches or transistors connected back-to-back, in particular two field effect transistors connected back-to-back, preferably two MOSFETs, or when the semiconductor switching device consists of such a back-to-back connection. In other words, the hybrid switch is a parallel circuit of the relay and two semiconductor switches connected back-to-back, in particular a parallel circuit of a relay and two field effect transistors, preferably MOSFETs, connected back-to-back. This parallel circuit is connected serially into the string line.

According to a preferred embodiment of the present disclosure, the switching device may additionally comprise a reverse current protective circuit. The switching device may comprise a sensor connected to the control device, for measuring an electrical parameter on the associated photovoltaic string, and the control device is configured to be responsive to the electrical parameter as measured by the sensor by automatically interrupting the connection of the associated photovoltaic string to the central collection point also in the reverse current direction. In other words, the switching device is preferably combined with the reverse current protection function according to DE 10 2016 117 049. Thus, the prevention of reverse currents according to the disclosure described in DE 10 2016 117 049 can be combined with a user-controlled shutdown in the DC part of a photovoltaic system, although this is optional.

The switching device is preferably configured, when switching on or electrically connecting the associated photovoltaic string to the current collector, to first close the semiconductor switching device, in particular the one or more field effect transistor(s), preferably MOSFETs, and then, only after a time delay, to close the relay.

The switching device is furthermore preferably configured, when switching off or disconnecting the associated photovoltaic string from the current collector, to first open the relay and then, only after a time delay, to open the semiconductor switching device, in particular the one or more field effect transistor(s), preferably MOSFETs.

In this way, it can be ensured that the relay does not have to support the full string voltage, so that an arc not extinguishing due to the DC voltage can be avoided. The relay nevertheless relieves the semiconductor switching device during continuous operation, so that long-term power dissipation can be kept in a range that is acceptable for the specific installation conditions in a photovoltaic generator. No high-current relay needs to be used, rather, a simple small standard relay can be used. The relay is spared, which enhances the durability of the switching device and allows to guarantee safety, reliability, and longevity in the degree required for photovoltaic systems.

The switching device may be configured to perform a check routine before (re-) connecting the at least one photovoltaic string, to check at least one electrical parameter of the associated photovoltaic string in the check routine, and, if a predefined threshold for the at least one electrical parameter is met, to switch on the at least one photovoltaic string, if release has been accorded by the user.

The switching device may furthermore be configured to measure the photovoltaically generated current flow through the associated string line and to close the relay only when the photovoltaically generated current I flowing through the string line exceeds a predefined threshold I_min, or after a time delay after the photovoltaically generated current I flowing through the string line has exceeded a predefined threshold I_min.

The switching device may furthermore comprise a control device and a sensor device connected to the control device for measuring at least one electrical parameter on the associated photovoltaic string. The control device may be configured to be responsive to the at least one electrical parameter measured by the sensor device by electrically connecting the associated photovoltaic string to the current collector, if release has been accorded by the user, and the sensor device in particular comprises an input voltage sensor which measures the string side input voltage U1 on the switching device and/or comprises an output voltage sensor which measures the collection point side output voltage U2 on the switching device. The control device may be configured to control the switching operations of the relay and/or of the semiconductor switches in response to the measured string side input voltage U1 and/or to the measured collection point side output voltage U2.

When switching on, a plurality of switching operations may first be performed by the semiconductor switching device, e.g. the back-to-back connected MOSFETs, for example until particular operating parameters are reached, before the relay is closed. In other words, when switching on, the relay remains open until particular operating parameters have been reached, even if a plurality of switching operations are performed by the semiconductor switching device during this time. Thus, the number of switching operations of the relay can be kept low. During production or continuous operation, however, in particular after the desired operating parameters have been reached, the relay will then relieve the semiconductor switching device. Nevertheless, bidirectional isolation of the electrical connection is achieved, i.e. the current flow is interrupted in both directions, when a back-to-back connection is used, and when the hybrid switch is fully open, i.e. when both the semiconductor switches and the relay are open.

The time delay when switching on and/or switching off is preferably less than or equal to 2000 ms, preferably less than or equal to 700 ms, preferably less than or equal to 300 ms. The semiconductor switching device should at least not be closed longer than for this maximum delay time while not being relieved by the relay, i.e. with the semiconductor switching device closed and the relay open, when the full (rated) string current or a string current of greater than or equal to 5 A, greater than or equal to 8 A, greater than or equal to 10 A, or 12.5 A+/−40%, flows through the semiconductor switching device. That means, the maximum delay time can be calculated from the time at which the rated current could flow, at least theoretically, i.e. if irradiation is appropriately strong. In other words, the hybrid switch is controlled such that a state in which the semiconductor switching device is closed, the relay is open, and at the same time the rated current can flow, i.e. the rated current can flow through the non-relieved semiconductor circuit, will exist no longer than for the maximum delay time. Furthermore preferably, the delay time is between 50 ms and 2000 ms, preferably between 100 ms and 1000 ms, preferably between 150 ms and 500 ms, preferably between 200 ms and 300 ms, at least if a string current corresponding to the rated current flows or at least can flow in the photovoltaic string. Depending on which components are used, the semiconductor switching device can even be able to pass through the full string power alone without being relieved by the relay, even if it is installed in a string box without special cooling measures, at least for a correspondingly short delay time. Accordingly, the time delay of the switching operation of the semiconductor switching device may therefore be given with respect to the previous switching operation of the relay, or vice versa, or to the reaching of particular threshold values of the electrical parameters, e.g. for the input voltage U1, for the output voltage U2, and/or for the string current I.

The part of the photovoltaic generator which is switched by the switching device, i.e. in particular the associated photovoltaic string, preferably has a DC rated voltage of greater than or equal to 300 V, preferably greater than or equal to 600 V, preferably greater than or equal to 800 V, preferably 1250 V+/−30%, and/or a DC rated current of greater than or equal to 5 A, preferably greater than or equal to 8 A, preferably greater than or equal to 10 A, preferably 12.5 A+/−40%.

The hybrid switch as a whole is therefore adapted for a DC switching voltage of greater than or equal to 300 V, preferably greater than or equal to 600 V, preferably greater than or equal to 800 V, preferably 1250 V+/−30%, and/or for a DC lead-through current of greater than or equal to 5 A, preferably greater than or equal to 8 A, preferably greater than or equal to 10 A, preferably 12.5 A+/−40%. In particular, the hybrid switch as a whole is configured for a DC switching voltage of greater than or equal to 300 V, preferably greater than or equal to 600 V, preferably greater than or equal to 800 V, preferably 1250 V+/−30%.

In particular, the semiconductor switching device or the one or more field effect transistor(s), preferably MOSFETs, are preferably adapted for a drain-source voltage ($V_{DS}$) of greater than or equal to 300 V, preferably greater than or equal to 600 V, preferably greater than or equal to 800 V, preferably 1250 V+/−30%.

The semiconductor switching device or the one or more field effect transistor(s), preferably MOSFETs, are preferably adapted for a drain current ($I_D$) of greater than or equal to 5 A, preferably greater than or equal to 8 A, preferably greater than or equal to 10 A, preferably 12.5 A+/−40%.

Due to the short duration of current flow through the semiconductor switching device, the resulting power dissipation at the hybrid switch is nevertheless acceptable. There is no need to use excessively large and expensive semiconductor switches.

Field-effect transistors, preferably MOSFETs can be used, which have a drain-source on-resistance ($R_{DS(on)}$, for short) of greater than or equal to 100 mOhms preferably greater than or equal to 300 mOhms, preferably greater than or equal to 500 mOhms, preferably 690 mOhms+/−40%.

Although this generates rather large power dissipation of possibly one watt, a few watts or more, this is nevertheless acceptable in particular due to the relief provided by the parallel-connected relay. Such field effect transistors, in particular MOSFETs, are available at low cost and have a small installation size.

The one or more semiconductor switches, field-effect transistors, or MOSFETs may even have a calculated power dissipation of greater than or equal to 2 W, greater than or equal to 5 W, greater than or equal to 10 W, in particular greater than or equal to 40 W, based on a rated current of 8.5 A or 10 A of the at least one photovoltaic string, when the one or more semiconductor switches, field effect transistors, or MOSFETs are closed and the relay is open (intermediate switching state).

On the other hand, the hybrid switch still only generates a calculated power dissipation of preferably less than or equal to 10 W, preferably less than or equal to 5 W, preferably less than or equal to 2 W, preferably less than or equal to 1 W, based on a rated current of 8.5 A or 10 A of the at least one photovoltaic string, when the semiconductor switching device and the relay are closed (continuous operation state). In particular during the production mode, the hybrid switch has a power dissipation of less than or equal to 1 W, for example at 1000 volts and 10 amps (typically plus 25% reserve) per photovoltaic string, when the semiconductor switching device and the relay are closed.

The relay is preferably adapted for a DC lead-through current of greater than or equal to 5 A, preferably greater than or equal to 8 A, preferably greater than or equal to 10 A, preferably 12.5 A+/−40%. On the other hand, it is preferably sufficient if the relay is adapted for a DC switching current of less than or equal to 8 A, in particular less than or equal to 6 A, in particular less than or equal to 4 A, in particular 2 A+/−50%.

Furthermore preferably, it is sufficient if the relay features a maximum AC switching voltage of less than or equal to 800 V, in particular less than or equal to 500 V, in particular of 400 V+/−50%.

This helps to keep cost and size of the relay within reasonable limits, especially for installation in a string box.

Furthermore preferably, the switching device may be configured to check electrical parameters of the associated photovoltaic string in a check routine before (re-) connecting the associated photovoltaic string, and to close the switching device if predefined threshold values for the electrical parameters are met and after release has been accorded by the user. That means the switching device is only closed when both is fulfilled, i.e. if the test conditions for the electrical parameters are met and the user has accorded release for (re-)connection. Only then is the associated photovoltaic string switched back on. In particular, the semiconductor switches may first be closed for checking purposes, and electrical parameters such as input voltage, output voltage, and/or string current may be measured, while the relay is still open. This procedure may be repeated multiple times before the relay is closed too, so that the relay can be spared.

Thus, the switching device in particular comprises a current sensor which measures the photovoltaically generated current flow through the associated string line. The switching device preferably closes the relay only when the photovoltaically generated current flowing through the string line exceeds a predefined threshold value. In this way it can be ensured that the associated photovoltaic string is only put into continuous production mode when it is fully operational.

In the part of the photovoltaic string in which the full nominal voltage of the plurality of photovoltaic modules or of the entire photovoltaic string is applied, the photovoltaically generated current flows preferably exclusively through metallic conductors, e.g. metallic cables, metallic connectors and the relay, and at least not permanently through semiconductor devices, preferably at least temporarily, in particular during the continuous production mode of the photovoltaic string. As a result, power dissipation can be kept low so that the switching device can optionally be installed in existing housings without overheating them.

In a multi-string photovoltaic system, each parallel photovoltaic string preferably has such a switching device upstream of the central collection point. The switching devices cover multiple photovoltaic modules, i.e. they are each responsible for the entire photovoltaic string comprising a plurality of series-connected photovoltaic modules.

At their input side (i.e. photovoltaic string side or photovoltaic module side), the switching devices have a positive pole input and a negative pole input for connecting the positive pole and negative pole of the string line, respectively, and at their output side (i.e. collection point side) they have a positive pole input and a negative pole input for connecting the positive pole and the negative pole of an extension of the string line to the central collection point of the photovoltaic strings or to the DC input of the inverter. Accordingly, in particular the entire string voltage is applied to the switching device, and/or the entire string current flows through the switching device.

As already stated above, the present disclosure may be combined with the reverse current protection according to DE 10 2016 117 049. If the switching device is also effective as a reverse current protection device in a multi-string photovoltaic system, it additionally prevents a cross current from becoming so strong that the direction of current flow is reversed in the associated photovoltaic string, i.e. a negative current flows back into the associated photovoltaic string. This can in particular be achieved with the back-to-back connection of two semiconductor switches, in particular the back-to-back connection of two field-effect transistors, e.g. MOSFETs. Therefore, unwanted reverse currents can be prevented, which could otherwise arise if the associated photovoltaic string should have a lower impedance than the inverter or the respective current collector downstream of the central collection point. This can have a positive impact on the service life of the associated photovoltaic modules. Depending on the safety equipment of the photovoltaic system, the reverse current protection function may also increase the safety of the system, in particular when switching off individual photovoltaic strings or the photovoltaic system, for example due to inadequate irradiation, for maintenance work, or in the event of an emergency shutdown, in particular as the reverse current protection function prevents that a shutdown of the associated photovoltaic string is prevented due to a reverse current.

Preferably, the switching device is installed in an electrically insulating housing, which has a positive pole port for the positive pole of the string line and a negative pole port for the negative pole of the string line of the associated photovoltaic string at the string side input. Furthermore preferably, the switching device has a positive pole port for the plus pole and a negative pole port for the negative pole of the extension of the string line which leads to the central collection point at the collection point side output. The ports on the housing are preferably provided in the form of photovoltaic plug-in connectors, e.g. according to Applicant's/proprietor's SUNCLIX® system. The housing with the switching device, which can be installed in the two conductors of the string line of the associated photovoltaic module using the plug-in connectors, can therefore form a separately pluggable unit in the form of a string box, which may even be integrated into existing string lines between the photovoltaic modules of a respective photovoltaic string and the central collection point or the common inverter, as a retrofit solution, in order to retrofit an existing multi-string photovoltaic system.

Preferably, the switching device comprises a sensor connected to the control device, for measuring an electrical parameter on the associated photovoltaic string. In response to the electrical parameter measured by the sensor, the control device can switch the switching device, but optionally only if release has been accorded by the user. In response to the electrical parameter measured by the sensor, the control device in particular prevents the switching device and/or at least the relay from being closed if the measured electrical parameter does not meet a safety condition for the first electrical parameter, that is decisive for the restart, for example.

The sensor is preferably a current sensor or a voltage sensor which measures at least one of the following electrical parameters:
  input voltage at the string side input of the switching device;
  output voltage at the collection point side or inverter side output of the switching device;
  string current of the associated photovoltaic string or through the switching device or string box;
  negative current flow.

A negative current flow means that the current in the photovoltaic string flows through the switching device in the opposite direction to the current flow photovoltaically generated during operation. That is to say, the current sensor is in particular configured to be able to measure a negative current flow as well.

The hybrid switch may open in response to one or more of these electrical parameter(s) measured by the one or more sensor(s) and interrupt the connection of the associated photovoltaic string to the current collector. Thus, the switching device preferably comprises a current sensor which is capable of optionally measuring negative currents as well, and/or an input voltage sensor and/or an output voltage sensor.

Further details of an optional additional reverse current prevention will now be described below.

According to a preferred embodiment of the present disclosure, the sensor is a current sensor which is also able to measure a negative current flow through the switching device. The switching device can interrupt the connection of the associated photovoltaic string to the central collection point, i.e. to the parallel connection with the further photovoltaic strings and to the DC input of the inverter, at least if the current in the associated photovoltaic string is negative and/or exceeds a predefined threshold value for the absolute value of the negative current. However, a negative current is not a necessary condition for such disconnection. Depending on which operating and safety parameters are specified, the switching device may already cause the interruption when the current is still positive, but is below a predefined safety threshold. This may happen, for example, when the photovoltaic modules of the associated photovoltaic string are significantly more shaded than the photovoltaic modules of the further photovoltaic strings. In this case, the cross currents may not yet cause a negative current flow in total in the associated photovoltaic string, but may already reduce the photovoltaic power generated by the associated photovoltaic string to such an extent that a production mode of that associated photovoltaic string does not make sense any more in terms of economics, so that it is better to break the connection of this associated photovoltaic string to the parallel circuit with the further photovoltaic strings and to the shared inverter. This may in particular be useful if the current measured by the switching device is still positive, but is considerably below the maximum current of the photovoltaic string, e.g. less than 10% of the maximum current of the photovoltaic string. In other words, the control device is preferably configured to automatically switch the switching device and interrupt the connection of the associated photovoltaic string to the parallel circuit and to the inverter when the condition occurs that the string current I becomes lower than a predefined threshold value I0. The predefined threshold value I0 may be selected from between positive and significantly smaller than the maximum current of the associated photovoltaic string and a negative safety value for the current flow. In mathematical terms, the switching condition can be defined as I<I0, where I0 is selected from an interval [I1, I2], wherein I1 is a negative safety value at which the associated photovoltaic string could be damaged, and I2 is a positive value below which economic operation no longer makes sense.

In particular, the switching device also electrically reconnects the associated photovoltaic string to the parallel connection comprising the further photovoltaic strings and to the common inverter, if the operating and safety parameters permit this and if release has been accorded by the user, e.g. in the form of a trigger signal, for example by a closed switch. For this purpose, the control device is connected to a sensor device for measuring at least one electrical parameter.

According to a further embodiment, in response to the measured string side input voltage and/or to the measured collection point side or inverter side output voltage, the switching device electrically reconnects the associated photovoltaic string, whose connection to the central collection point has been interrupted, to the central collection point with the further parallel-connected photovoltaic strings and thus to the DC input of the inverter, if release has been accorded by the user.

According to a further preferred embodiment of the present disclosure, the input voltage is compared with the output voltage, and the controller controls the switching device in response to the comparison of the measured string side input voltage and the measured current collector side output voltage, in particular so that the associated photovoltaic string whose connection to the current collector has been interrupted is reconnected to the current collector, when the user has accorded release. With the voltage comparison it can be ensured that the desired operating and safety parameters are met after the electrical reconnection of the associated photovoltaic string, e.g. that no negative current will flow back into the associated photovoltaic string, or that the positive production current exceeds a minimum value, by electrically reconnecting the associated photovoltaic string only if the difference of output voltage U2 minus input voltage U1 is smaller than a predefined threshold U0. If U0=0, this means that the output voltage U2 is smaller than the input voltage U1. In this case, a certain tolerance may be provided, in particular it is possible to exploit the effect that the input voltage of the associated photovoltaic string whose connection to the central collection point has been interrupted is an open-circuit voltage, whereas the output voltage which is the voltage generated by the further parallel photovoltaic modules already is a load voltage, which is typically lower by about 20% than the open-circuit voltage, because the inverter is already working. Accordingly, in response to the comparison of the open-circuit voltage of the associated photovoltaic string with the load voltage of the further photovoltaic strings, the control device can reconnect the associated photovoltaic string, whose connection to the central collection point has been interrupted, to the central collection point with the further parallel photovoltaic strings and thus to the DC input of the inverter, if release has been accorded by the user. In addition to the voltage comparison, it may be checked whether the voltage of the associated photovoltaic string exceeds a predefined threshold value U_min, for example in order to ensure that the associated photovoltaic string is able to generate sufficient power at this time.

In its closed state, the switching device electrically connects the associated photovoltaic string to the current collector, and in its open state it bi-directionally interrupts the current-carrying connection of the associated photovoltaic string to the current collector in the string line.

The semiconductor switches and/or the relay used are preferably configured as normally open (NO) or make contact switch. In fact, this may seem disadvantageous at first glance, since electrical power is needed to hold the on-state. However, this is accepted in order to achieve the associated safety, namely that the connection of the associated photovoltaic string to the parallel circuit with the further photovoltaic strings and to the DC input of the inverter is interrupted in the normal state of the switching device.

The present disclosure is preferably for use in photovoltaic systems in which the series-connected photovoltaic modules in at least one of the photovoltaic strings, preferably in all photovoltaic strings, each have protective circuits which allow to individually disconnect the photovoltaic modules from the associated photovoltaic string, and in which the protective circuit of the individual photovoltaic modules short-circuits the output of the respective photovoltaic module at the connection points for the string line so as to produce a low-resistance bypass for the respective photovoltaic module. Such protective circuits for the photovoltaic modules are described in more detail in WO2013/026539 A1 to which reference is hereby made and which is hereby incorporated by reference in this regard. Furthermore, the present disclosure is preferably for use in photovoltaic systems in which the associated photovoltaic string has a start circuit which is configured to re-enable such or other protective circuits of the individual photovoltaic modules of the associated photovoltaic string. Such start circuits for the photovoltaic strings are described in more detail in WO2014/122325 A1 to which reference is hereby made and which is hereby incorporated by reference in this regard.

Such a start circuit for starting the associated photovoltaic string and the switching device for the associated photovoltaic string may preferably be accommodated in a common housing, so that a string box with combined connection and disconnection function for the associated photovoltaic string is provided. The string box with positive pole and negative pole ports at the input and positive pole and negative pole ports at the output of the string box is connected into the associated photovoltaic string between the series of photovoltaic modules of the associated photovoltaic string and the central collection point to the other photovoltaic strings. So, unnecessary components, in particular connectors can be dispensed with, which can have a positive impact on the cost, service life, and power dissipation of the photovoltaic system. During production mode with the relay closed, power dissipation of the switching device is so low that the thermal load is acceptable.

Preferably, each photovoltaic string is equipped with the described switching device or string box covering multiple photovoltaic modules.

The present disclosure furthermore relates to an electronically controlled DC isolation switching device for the DC part of a photovoltaic system for disconnecting at least one photovoltaic string from a current collector, e.g. an inverter, the DC isolation switching device comprising a hybrid switch consisting of a relay, in particular an electromechanical relay, and a semiconductor switching device connected in parallel to the relay.

The present disclosure furthermore relates to the use of such a switching device for the DC part of a photovoltaic system.

The present disclosure furthermore relates to a method for switching off and back on at least one photovoltaic string of a photovoltaic system, the method comprising the steps of:

user-controlled triggering of the switching device of the at least one photovoltaic string by an electrical or electronic trigger signal in order to disconnect the at least one photovoltaic string from the current collector;

user-controlled triggering of the switching device of the at least one photovoltaic string by an electrical or electronic trigger signal in order to reconnect the at least one photovoltaic string to the current collector, optionally in response to the meeting of further test conditions.

It will be apparent to a person skilled in the art that although the present disclosure can be used preferably for photovoltaic systems, it can also be used, in principle, for other DC generators, which shall not be excluded.

The present disclosure will now be explained in more detail by way of exemplary embodiments and with reference to the figures in which the same and similar elements are partly denoted by the same reference numerals. The features of the various exemplary embodiments may be combined with each other.

BRIEF DESCRIPTION OF THE FIGURES

FIG. 6 is a flow chart for starting, checking, and disconnecting the associated photovoltaic string.

DETAILED DESCRIPTION

Figure 1:
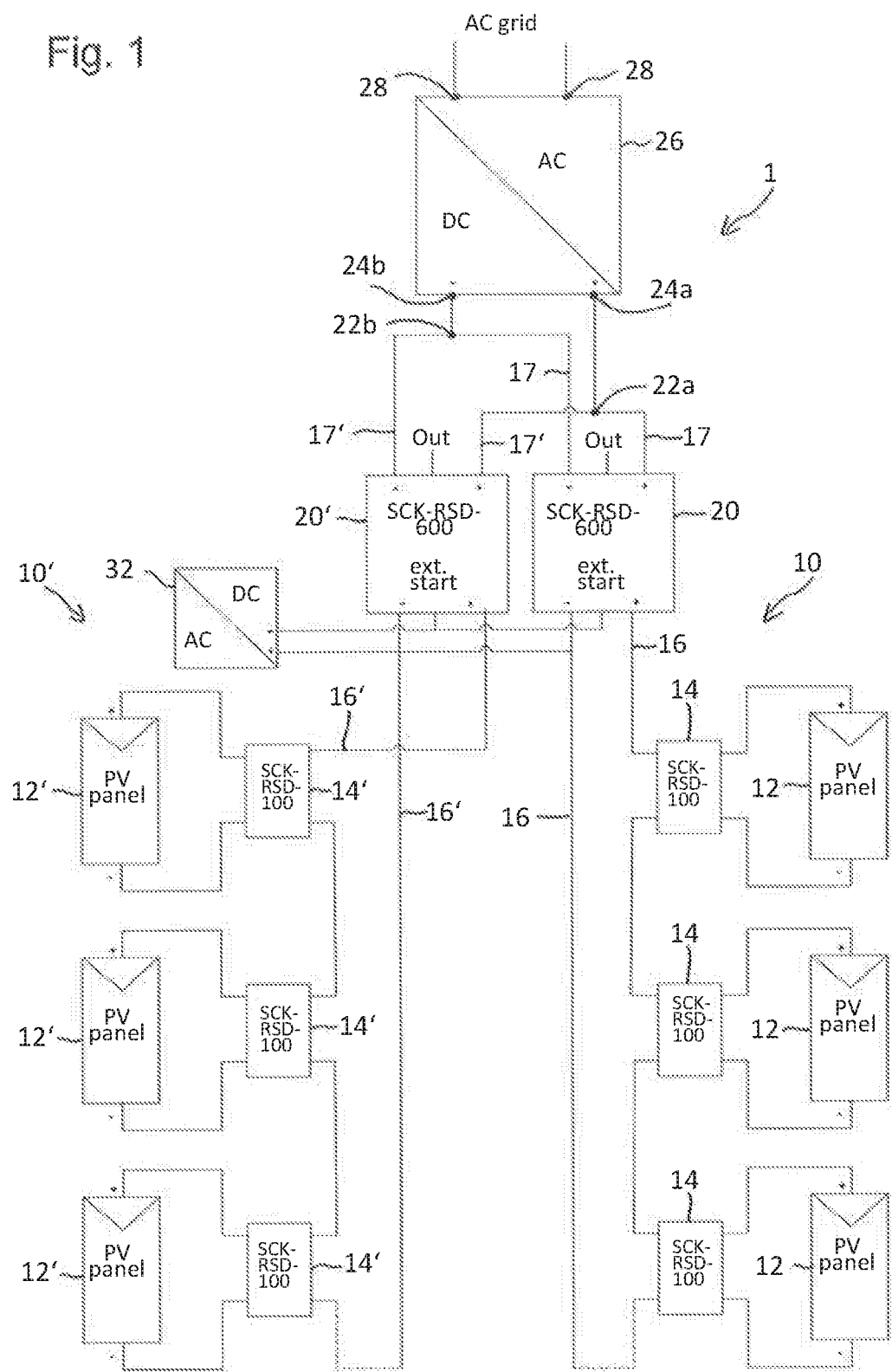
FIG. 1 shows a block diagram of a photovoltaic system with parallel photovoltaic strings.

Referring to FIG. 1, the multi-string photovoltaic system 1 comprises a plurality of parallel-connected photovoltaic strings, of which only two photovoltaic strings 10, 10' are shown, for the sake of simplicity.

Each photovoltaic string comprises a plurality of photovoltaic modules or photovoltaic panels 12, 12', each one equipped with a protective circuit 14, 14', for example as described in WO 2013/026539 A1. Each of protective circuits 14, 14' is associated with a photovoltaic module 12, 12', and the respective string line 16, 16' extends through the protective circuit 14, 14' associated with the photovoltaic string 10, 10' in bipolar manner.

Figure 2:
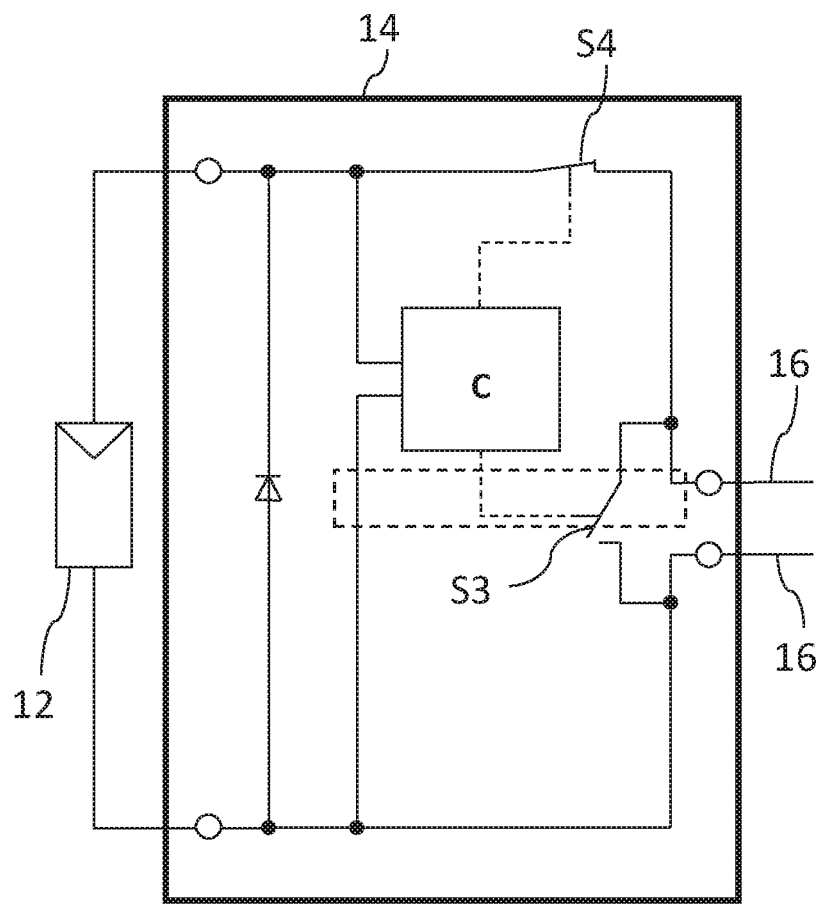
FIG. 2 is a block diagram of a protective circuit for a photovoltaic module.

Referring to FIG. 2, each protective circuit 14, 14' includes a short-circuiting switch S3 for short-circuiting the associated photovoltaic module 12, 12' at the string side, and a series-connected isolating switch S4 which allows to disconnect the associated photovoltaic module 12, 12' from the photovoltaic string 10' 10'. Upon shading or failure of a photovoltaic module 12, 12', the short-circuit switch S3 will close and the serial isolating switch S4 will open, so that the respective photovoltaic module 12, 12' is disconnected from the photovoltaic string, idling, while the photovoltaic string 10, 10' remains closed, so that the photovoltaically generated current of the remaining photovoltaic modules of this photovoltaic string 10, 10' can continue to flow through the string line 16, 16' which is closed even in this protective state. For further details of the protective circuit 14, 14' which is optional for the present disclosure, reference is made to WO 2013/026539 which is hereby incorporated into the present disclosure by reference.

Referring again to FIG. 1, a string box 20, 20' is installed in each photovoltaic string 10, 10', which may be configured as a start box in accordance with WO 2014/122325 A1 and through which both string lines 16, 16' extend. On the inverter side of the string boxes 20, 20', extensions 17, 17' of the string lines 16, 16' are connected together in parallel at a central collection point 22a, 22b, or at the positive pole and negative pole thereof, in order to feed the photovoltaically generated power of the plurality of parallel-connected photovoltaic strings 10, 10', etc., as in this example, into the DC input 24a, 24b of the common inverter 26. At the AC output 28 of the inverter 26, the AC power is provided for being fed into a power grid.

In the present example, the string boxes 20, 20' are powered by an external 24 volt power supply 32 (FIG. 1) to perform the desired switching operations. However, power supply may also be provided by a start photovoltaic module which has no protective circuit 14, 14' and therefore will automatically supply electrical power to the respective photovoltaic string 10, 10' in case of incident light, and hence also to the associated string box 20, 20'. For further details about this, reference is made to WO 2014/122325 A1 which is hereby incorporated into the subject matter of the present disclosure by reference.

Figure 3:
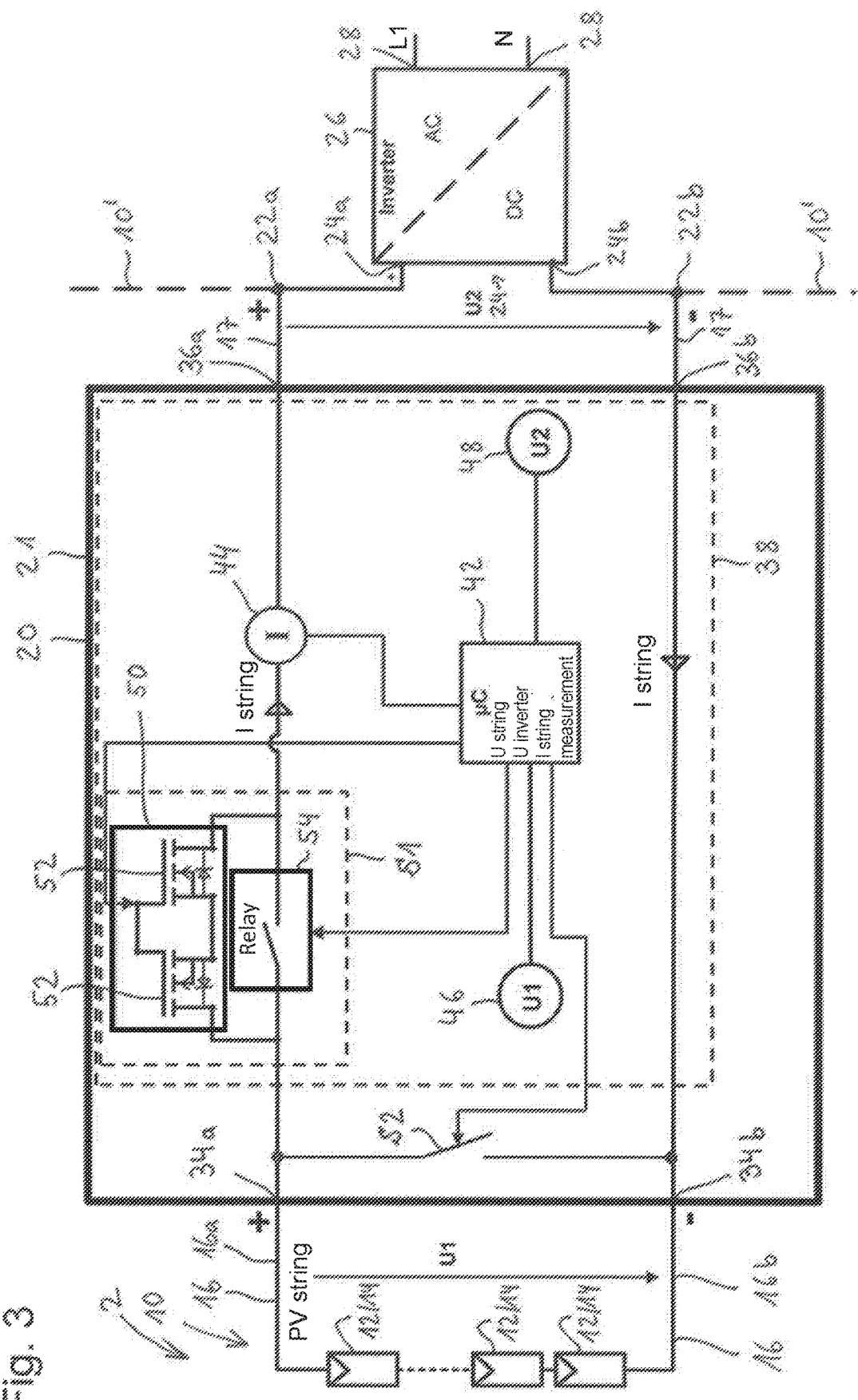
FIG. 3 is a block diagram of a string box including the switching device.

Referring to FIG. 3, a string box 20 of one of the photovoltaic strings 10 is shown in greater detail. All other parallel-connected photovoltaic strings 10, 10', etc., if present, preferably have the same configuration. However, the present disclosure may also be used in a single-string photovoltaic system 1, i.e. with a DC generator 2 consisting of only one photovoltaic string 10.

The photovoltaic modules 12, with the protective circuit 14 connected thereto and not shown separately in FIG. 3 for the sake of simplicity, are series-connected to form the photovoltaic string 10. The positive pole 16a and the negative pole 16b of string line 16 are connected to a positive pole input 34a and a negative pole input 34b of the string box 20 to be fed into the string box 20. Respective extensions 17 of the string line 16 are connecting a positive pole output 36a and a negative pole output 36b to the positive pole 24a and to the negative pole 24b, respectively, of the DC input 24 of the inverter 26 which is the current collector for the photovoltaically generated current in this example. Accordingly, during production mode, the current photovoltaically generated by the photovoltaic modules 12 of photovoltaic string 10 flows through the string box 20. At the inputs and outputs 34a, 34b; 36a, 36b, the module side and collection point side sections 16, 17 of the string line are preferably connected using plug-in connectors (not shown). Further optional parallel photovoltaic strings 10' are symbolized by the dashed lines leading to the two poles of the central collecting point 22a, 22b.

String box 20 includes a switching device 38 which is integrated in the preferably waterproof plastic housing 21 of string box 20. Switching device 38 comprises a hybrid switch S1 which is connected in series into the photovoltaic string 10, in this example into a branch of the string line (the positive pole in the present example). The series-connected hybrid switch S1 allows to interrupt the current-carrying connection of the associated photovoltaic string 10 to the inverter 26 in a user-controlled manner to thereby switch off the associated photovoltaic string 10. A control device 42 in the form of a microcontroller controls the serial hybrid switch S1, which may also be referred to as an isolation hybrid switch, and monitors a current sensor 44, an input voltage sensor 46, and an output voltage sensor 48 to acquire electrical parameters of the associated photovoltaic string 10.

Input voltage sensor 46 is connected in parallel to the input terminals 34a, 34b of string box 20 to measure the input voltage U1 which is the string voltage of the associated photovoltaic string 10. Output voltage sensor 48 is connected in parallel to the output terminals 36a, 36b of string box 20 to measure the output voltage U2 which is the voltage applied to the inverter 26. In the case of a multi-string photovoltaic system, the output voltage U2 is that voltage which is applied to the inverter 26 by the parallel connection of all further photovoltaic strings. During production mode, the current sensor 44 measures the string current which, when the photovoltaic string 10 produces power, flows through the string line 16, the string box 20, and the extension 17 of the string line into the inverter 26 in the normal direction referred to as positive herein, to be fed into the inverter 26. Optionally, the current sensor 44 is configured to moreover measure a current flow in the reverse direction, i.e. a negative current with respect to the normal current direction when the photovoltaic string produces power (i.e. of reverse polarity to the DC inputs 24a, 24b of the inverter). Alternatively, however, two separate current sensors may be provided, one for the positive current flow and one for the negative current flow (not shown). Accordingly, if desired, the switching device 38 is configured to measure a positive and/or negative current flow.

In the basic position of the string box 20 or the switching device 38, the serial hybrid switch S1 is open and is in its normal state (normally open). A major function of the serial hybrid switch S1 is to interrupt the current-carrying connection of the associated photovoltaic string 10 to the inverter 26. A short-circuiting switch S2 is used to trigger string side short-circuits in the associated photovoltaic string 10 and to enable the photovoltaic modules 12 of the associated photovoltaic string 10 through an injected starting current. Once the start pulse has been transmitted, the string voltage U1 and the inverter voltage U2 are measured and compared, in order to electrically connect the associated photovoltaic string 10 to the inverter 26 in response to the voltage comparison, optionally if release has been accorded by the user.

In the present example, the serial hybrid switch S1 is closed in response to a comparison of the string voltage U1 and the inverter voltage U2, i.e. the switching condition for switching on the serial hybrid switch S1 depends on a comparison of string voltage U1 and inverter voltage U2 in this example. The serial hybrid switch S1 is in particular only closed if the string voltage U1 of the associated photovoltaic string 10 is either greater than the inverter voltage U2 or if it is smaller than the inverter voltage U2 only by a predetermined threshold U0 (slightly smaller). In other words, a switching condition for the serial hybrid switch S1 for electrically connecting the photovoltaic string 10 to the parallel circuit and to the inverter 26 is U1≥U2−U0, wherein U0 is a predefined value for a maximum allowable voltage difference for safely connecting the associated photovoltaic string 10 to the inverter. The switching value U0 predefined and stored in the microcontroller is therefore (significantly) smaller than the maximum possible voltage of the associated photovoltaic string 10. Only if such a switching condition is satisfied, which depends on electrical parameters of the associated photovoltaic string 10 and possibly of the further photovoltaic strings, the control device 42 will drive the serial hybrid switch S1 so that the hybrid switch S1 is closed so as to connect the associated photovoltaic string 10 to the inverter 26. Thus, in this particular exemplary embodiment, a system start of the associated photovoltaic string 10 is possible even without the risk of undesirable reverse currents to occur.

In order to detect unwanted reverse currents from the further photovoltaic strings that are provided in the present example into the associated photovoltaic string 10 during the production mode during which the serial hybrid switch S1 is closed, current flow and current flow direction are monitored during the production mode. For this purpose, continuous current measurement is performed using the current sensor 44. Accordingly, the string current is permanently monitored by means of current sensor 44, including the sign of the string current, i.e. whether the string current becomes negative. Should the string current become negative or should a condition close to that be reached, the microcontroller 42 will drive the serial hybrid switch S1 to open and interrupt the current carrying connection of the photovoltaic string 10 to the central collection point 22a, 22b and to the inverter 26.

In order for all string boxes 20 to properly disconnect the respectively associated photovoltaic string 10 from the inverter 26 when the entire photovoltaic system 1 is shut down, the serial hybrid switches S1 of all switching devices 38 of all the photovoltaic strings, if provided, are preferably opened as well, as soon as the inverter voltage U2 falls below a predefined minimum voltage U_min, wherein U_min may be in the range of about 30 volts.

Figure 4:
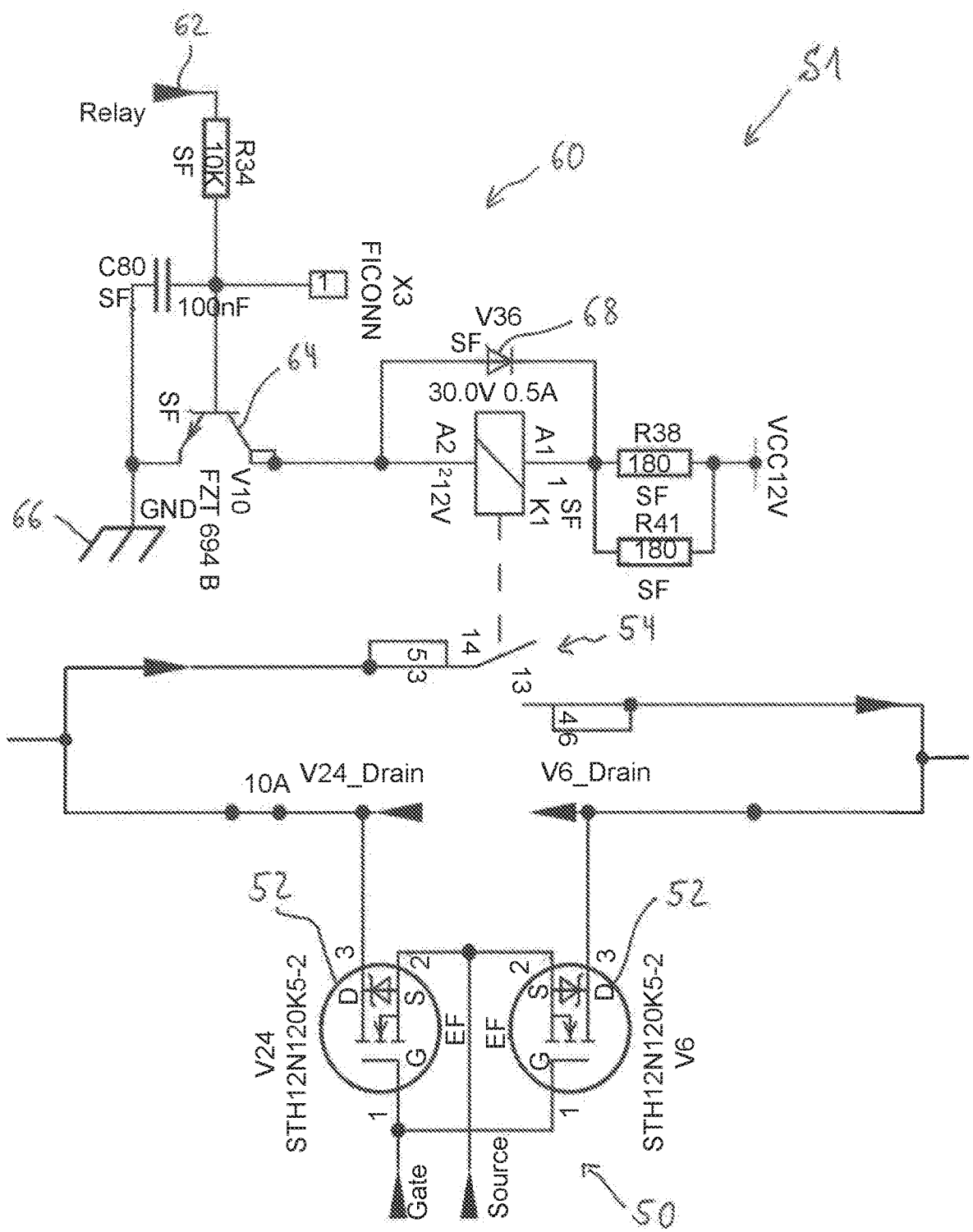
FIG. 4 is a circuit diagram for driving the hybrid circuit consisting of a relay and back-to-back connected MOSFETs.

Referring to FIGS. 3 and 4, the hybrid switch S1 comprises a parallel circuit consisting of two semiconductor switches connected back-to-back 50, in this example two field-effect transistors, more specifically two MOSFETs 52, and one electromechanical relay 54. The hybrid switch S1 as a whole is adapted for the full nominal string voltage and the full nominal string current of the associated photovoltaic string 10, which is typically up to 1000 volts or even 1500 volts, and 10 A, for example. However, the MOSFETs 52 have a typical on-resistance, known as drain-source on-resistance or $R_{DS(on)}$, of 690 mOhms in this example. As a result, power dissipation in the range of a few watts may arise at MOSFETs 52 in the case of a typical photovoltaic string 10. For example, with an $R_{DS(on)}$ of 690 mOhms and a nominal string current of $I_{nom}$=10 A, a calculated power dissipation is $P_{PD}=R_{DS(on)}*(I_{nom})^2$, i.e. $P_{PD}$=69 watts in this example. Since such power dissipation is undesirable, in particular for installation into existing (plastic) housings, the relay 54 relieves the back-to-back connected 50 two MOSFETs 52 during continuous operation. That is to say, the switch-on operation is first performed by the back-to-back connected two MOSFETs 52, and once the associated photovoltaic string 10 has been in production mode for a certain minimum time duration, the parallel relay 54 is closed in order to relieve the MOSFETs 52. On the one hand, this avoids to permanently generate high power dissipation at the MOSFETs 52, and on the other hand a relay 54 can be used, which alone would not be suitable for performing switching operations at a nominal DC string voltage of 1000 V or even 1500 V without incurring an increased risk of creating a non-extinguishing arc due to the DC voltage.

Despite the high requirements in terms of nominal string voltage, nominal string current, and the DC application, it is possible for the hybrid switch S1 to be configured using commercially available, rather small and cost-effective components.

For example, the relay types RT.3T and RTS3L from TE Connectivity Ltd. (cf. www.te.com) with the properties listed below have proven to be suitable:

1 pole 16 A, 1 form A (NO) contact (AgSnO$_2$ or W pre-make contact + AgSnO$_2$)
mono- or bi-stable coil
5 kV/10 mm coil-contact
Reinforced insulation
WG Version: product in accordance with IEC60335-1
RTS3T: Electronic ballast UL508/NEMA 410 rated
RTS3T: 165/20 ms inrush peak current

| Contact data | RT.3T | RTS3L |
|---|---|---|
| Contact arrangement | 1 form A (NO) contact | |
| Rated voltage | 250 VAC | |
| Max. switching voltage | 400 VAC | |
| Rated current | 16 A | |
| Limiting continuous current (RTS3L) | 16 A, | UL: 20 A |
| Limiting making current max. 20 ms (incandescent lamps) | 165 A peak | 120 A peak |
| max. 200 µs | 800 A peak | |
| Breaking capacity max. | | 4000 VA |
| Contact material | W (pre-make cont.) + AgSnO$_2$ | AgSnO$_2$ |
| Contact style | pre-make contact | single contact |
| Frequency of operation, with/without load | 360/3600 h$^{-1}$ | |
| Operate/release time max., DC coil | 10/5 ms | |
| Operate/reset time max., bistable version | 10/10 ms | |
| Bounce time | max. 4 ms | |

For the back-to-back connection 50, MOSFET types STH12N120K5-2, STP12N120K5, STW12N120K5, or STWA12N120K5 from ST (cf. www.st.com) with the properties listed below have proven to be suitable:

| $V_{DS}$: | | 1200 V | |
|---|---|---|---|
| $R_{DS(on)}$ max. | | 690 mOhms | |
| $I_D$ | | 12 A | |
| $P_{TOT}$ | | 250 W | |
| $V_{GS}$ | Gate-source voltage | ±30 | V |
| $I_D$ | Drain current at $T_C = 25°$ C. | 12 | A |
| $I_D$ | Drain current at $T_C = 100°$ C. | 7.6 | A |
| $I_{DM}$ | Drain current (pulsed) | 48 | A |
| $P_{TOT}$ | Total dissipation at $T_C = 25°$ C. | 250 | W |
| $I_{AR}$ | Max. current during repetitive or single pulse avalanche | 4 | A |
| $E_{AS}$ | Single pulse avalanche energy | 215 | mJ |
| dv/dt | Peak diode recovery voltage slope | 4.5 | V/ns |
| dv/dt | MOSFET dv/dt ruggedness | 50 | V/ns |

With such a hybrid circuit 51 consisting of the relay 54 and the back-to-back connected 50 MOSFETs and with the associated control electronics, the photovoltaic string can be switched on and off safely and over a long service life.

Thus, the hybrid switch S1 is used to interrupt the current-carrying connection between the associated photovoltaic string 10 or the part of the DC generator 2 switched thereby and the central collection point 22a, 22b or the inverter 26, in the present example even bidirectionally, i.e. a possible current flow is interrupted in both directions in this example.

When the user initiates a trigger signal for switching off, which is indicated by the check condition "U ext. start=off", the control device 42 automatically opens the hybrid switch S1.

For switching off the photovoltaic string 10, first the relay 54 is opened, and then, only after a time delay, the back-to-back connection 50 is opened to disconnect the associated photovoltaic string 10 from the central collection point 22a, 22b. The time delay for switching on and/or off is about 200 ms to 300 ms in this exemplary embodiment, which is short enough not to overload the back-to-back connected MOSFETs 50/52 without dedicated cooling.

FIG. 4 shows the hybrid switch S1 with a drive circuit 60 for driving the relay 54, and a more detailed representation of the back-to-back connected MOSFETs 50/52.

At the control input 62 "relay", the drive circuit 60 receives a standard signal (0/1) as a trigger signal from control device 42. A bipolar transistor 64 connects to ground 66 "GND". For spark interruption, a flyback component, in the present example a flyback diode 68, is connected in parallel to the relay 54. The gate voltage of the semiconductor switching device 50 or back-to-back connected FETs is potential-free with respect to source.

Figure 5:
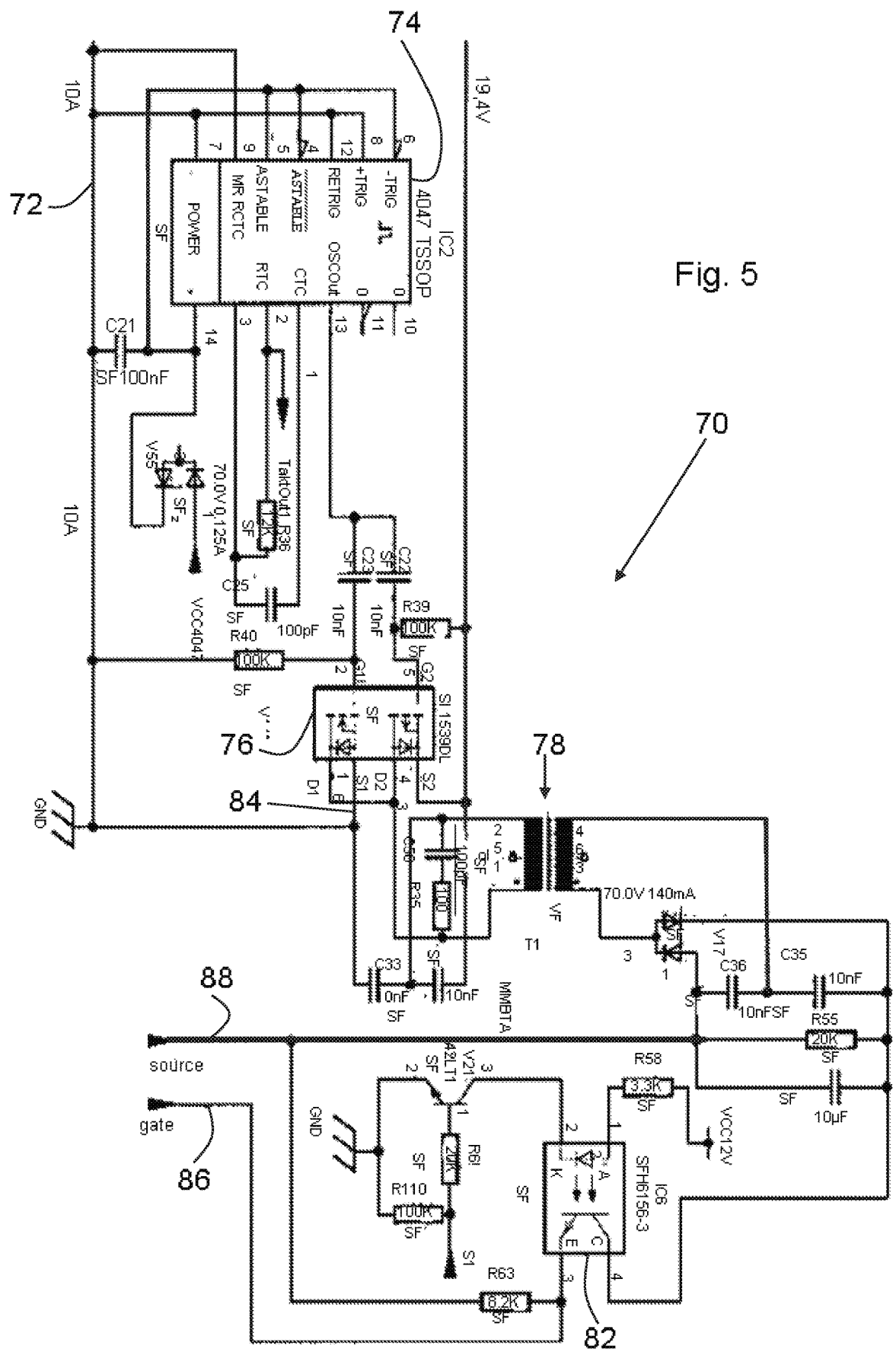
FIG. 5 is a circuit diagram for a switched-mode power supply for driving the back-to-back connected MOSFETs.

FIG. 5 shows a switched-mode power supply 70 for driving the back-to-back connected MOSFETs 50/52. Up to 10 A flow through drain. A clock generator 74 supplies a 50/50 clock at about 200 kHz to the switching transistors 76. This portion of the control which generates the drive signal for the back-to-back connected MOSFETs 50/52, is galvanically isolated from the back-to-back connected MOSFETs 50/52. Galvanic isolation is established by a PCB transformer 78.

Diodes V17, C35, C36 provide for rectification and smoothing of the chopped voltage of 19.4 V.

Furthermore, the driving for the back-to-back connected MOSFETs 50/52 comprises an optocoupler 82 which provides for galvanic isolation from the control device 42. The drive signal is provided via control output 84, and the voltage of the power supply is applied to the back-to-back connected MOSFETs 50/52 via optocoupler 82.

The gate 86 and source 88 ports represent the lines connected to the back-to-back connected MOSFETs 50/52.

Referring to FIG. 6, the start-up and shut-down sequence of switching device 38 is as follows, by way of example:

At system start-up, at 102, the hybrid switch S1 is open in step 104 (semiconductor switching device 50 and relay 54 open). A query in step 106 checks whether the input voltage U1 is below a minimum voltage U_min1. If the condition U1<U_min1 is satisfied, in the present example with U_min1=30 V DC, and if the user has accorded release for start-up (U ext. start=on), the start pulses are triggered in step 108, by short-circuiting switch S2, in order to start the associated photovoltaic string 10. Series-connected hybrid switch S1 remains open, and the control loops back to step 104.

Now, when the associated photovoltaic string 10 has been started by the start pulses, so that the associated protective circuits 14 have electrically connected the associated photovoltaic modules 12 to the photovoltaic string 10, the string voltage U1 should be well above the predefined minimum value U_min1, provided there is no fault and provided the associated photovoltaic string 10 is not completely shaded. So, once the condition U1<U_min1 is no longer satisfied in step 106, under normal irradiation and without malfunction, and release for starting (U ext. start=on) by the user continuous to be provided, another query is made in step 110 as to whether the input voltage U1 of the associated photovoltaic string 10 is greater than or equal to the output voltage U2 of the associated photovoltaic string 10 minus a predefined threshold value U0 (U1≥U2−U0), wherein U0 is 20 V DC in this example, but could also be zero. This condition should preferably be satisfied for a predefined minimum time t0, with t0=1 s in this case. Furthermore, it is again checked whether the voltage U1 is greater than or equal to a minimum value U_min2 in order to ensure that the associated photovoltaic string 10 is still electrically connected, and in the present example U_min2=150 V DC. Furthermore, it is again checked whether release by the user is given (U ext. start=on). If at least one of these three check conditions is not met in query step 110, control loops back to step 104 and to query 106.

However, if all of these three test conditions in query 110 are satisfied, it is checked in step 111 whether the string current I is greater than a predefined threshold value I_min, wherein I_min is 500 mA (in the positive direction) in the present example. If this test condition is not met, the microcontroller 42 controls the serial hybrid switch S1, in step 112a, such that initially only the semiconductor switching device 50 or back-to-back circuit is closed. If this test condition I>I_min is met, the microcontroller 42 controls the serial hybrid switch S1, in step 112b, such that the back-to-back circuit 50 remains closed and now the relay 54 is also closed. In both cases 112a, 112b, the associated photovoltaic string 10 is connected to the central collection point 22a, 22b, or the inverter 26, and the associated photovoltaic string 10 feeds electrical power into the inverter 26, here via the central collection point 22a, 22b, however, the hybrid switch S1 will work with especially low loss only after the relay 54 has been closed in step 112b, i.e. in the state of continuous production mode. Since the semiconductor switching device 50 or back-to-back circuit alone has already been closed in step 112a, this routine in step 112b causes a time-offset in the closing of the relay 54 only after a time delay following the closing of the back-to-back connected semiconductor switch 50 in step 112a. In the present example, the time delay is about 200 ms to 300 ms, which is short enough to not overload the back-to-back connected MOSFETs 50, even if the full nominal string current should flow.

The relay 54 takes over the current flow only with I>500 mA in the present example and only needs to switch a low voltage of typically 1 volt, so that a rather small, cost-effective relay can be used, which is in particular not adapted for switching 1000 V DC, for example featuring the properties as described above.

During production mode, it is than checked on a continuous or regular basis, in a checking step 114, (a) whether a negative current of greater than or equal to a predefined minimum value I_reverse is present, and this over a predefined minimum time t1 (t1=1 s), or (b) whether the input voltage U1 is below a predefined minimum value U_min3 (here U1_min3=150 V), or (c) whether the user has not accorded release (U ext. start=off). The minimum value I_reverse for the negative current is typically in the milliampere range. In the present example, therefore, the corresponding test condition is whether there is a negative current of at least 20 mA (I_reverse≤−20 mA). As long as all three test results (a), (b), (c) are negative, i.e. in logical terms (a) OR (b) OR (c)=no, the hybrid switch S1 is kept closed. Subsequently, a further test step 116 is performed by querying, during fault monitoring, whether the temperature is <130° C. and whether the differential voltage between U1 and U2 is greater than 2 V. If this fault check is also negative, control loops back to test step 111. Accordingly, steps 111-116 represent a permanent or continuous monitoring loop for the associated photovoltaic string 10 to ensure that even in the production mode no undesired values of the monitored electrical parameters occur.

If, as a result of the query in step 114, any one of the three test conditions mentioned is positive, i.e. in logical terms (a) OR (b) OR (c)=yes, for example if an unwanted high negative reverse current is existing, for instance because the associated photovoltaic string 10 is significantly more shaded than the other photovoltaic strings, or because the associated photovoltaic string 10 has lost driving voltage to the extent that the threshold condition U1<U_min3 is met, or because the user-controlled shutdown request is provided at the control device 42 (U ext. start=off), control loops back to step 104, i.e. the hybrid switch S1 opens, i.e. first the relay 54 opens, and only after a time delay the semiconductor switching device 50. Preferably, the hybrid switch S1, i.e. both the MOSFETs 52 and the relay 54, is configured as normally open (NO) switches, so that the hybrid switch S1 as a whole will automatically fall into the open state when the MOSFETs 52 and the relay 54 are not held in the closed state (loop 111-116). If necessary, the time delay is also ensured in this case. Thus, the loop 111-116 represents the production mode of the associated photovoltaic string 10.

At step 114, the user can intervene in loop 111-116, if desired, by triggering the condition U ext. start=off, in order to disconnect the current-carrying connection of the associated photovoltaic string 10 from the inverter 26 in a user-controlled manner and to switch off the associated photovoltaic string 10 in a user-controlled manner. If, in this way, the query in step 114 is set to "yes" by triggering the condition "U ext. start=off" in a user-controlled manner, the loop 111-116 will be interrupted and the control routine loops back to step 104, in which the hybrid switch S1 opens, even if all the electrical parameters meet the predefined test conditions. So, the user therefore has the option of triggering or initiating shutdown of the associated photovoltaic string 10 at his own discretion. Again, if necessary, the time delay is ensured.

If the fault monitoring in step 116 gives a positive result, i.e. if any one of the two mentioned fault conditions applies, the hybrid switch S1 is opened in a step 118, as in step 104, and additionally the signaling output is toggled to issue a fault message to the user. Subsequently, the cycle ends at step 120. This typically signals a fault.

The present disclosure allows to switch off in a user-controlled manner every photovoltaic string 10 that is equipped with such a switching device 38 and has been started or is in production mode, i.e. to disconnect it from the current collector 26. This is accomplished using the hybrid switch S1 comprising a parallel circuit of back-to-back connected MOSFETs 50 and a relay 54 and by appropriate control, e.g. according to FIG. 6.

The hybrid switch S1 installed in string box 20 is able to interrupt the photovoltaic string 10 and to prevent current flow. This will cause the protective circuits 14 (e.g. Phoenix Contact SCK-RSD-100) installed on the photovoltaic modules 12 in the present example to switch off as well. In other words, in the present example, the protective circuits 14 installed on the photovoltaic modules 12 will then automatically be disabled and switch off the individual photovoltaic modules 12, so that not only the entire photovoltaic string 10 will be electrically disconnected from the central collection point 22a, 22b, but moreover it will not carry voltage that is dangerous to the touch anymore.

To start the photovoltaic string 10, start pulses are sent via string line 16 to the protective circuits 14 of the photovoltaic modules 12 of the associated photovoltaic string 10 (step 108) to re-enable the non-loaded photovoltaic string 10 but not yet directly connect it to the central collection point 22a, 22b. Thereafter, the check routine with steps 110-116 according to FIG. 6 is performed.

The present disclosure allows the at least one photovoltaic string 10 to be switched on and off by a higher level (than module level) control unit and constitutes a functionality for the customer to be able to shut down photovoltaic strings or entire sections of a DC generator 2 not only in an emergency case but also for maintenance purposes, for example.

In summary, the present switching device 38 permits to switch a large power with low power dissipation and requires a small installation volume. Preferably, the nominal power of the photovoltaic string 10 is at least 10 kW, which can be switched by the hybrid switch S1 as a whole. Power dissipation of the hybrid switch S1 at nominal 1000 V and 10 A, however, is less than or equal to 10 W, preferably less than or equal to 5 W, preferably less than or equal to 2 W, preferably less than or equal to 1 W, when the current is commuted through the relay 54. The advantages of the different types of switching (electromechanical, semiconductor) are combined appropriately. When switching on, the semiconductor switching device 50 takes over the first switching operation to switch on and back off the up to 1000 V in the possibly small load range (e.g. up to 500 mA). Here, the semiconductor switching device 50 in view of the DC application is exploited, namely to allow to switch large voltages without arcing. After the switching of the semiconductor switching device 50, however, the primary matter is to get power dissipation of the flowing current under control. For this, the product parameters of a semiconductor are not ideally suited, because with increasing voltage at UBS, the internal lead-through resistance $R_{DS(on)}$ will increase too. For this purpose, an electromechanical switch in the form of a relay 54 is exploited. Although small-sized relays are not capable of isolating high DC voltages, large currents such as 16 amperes are unproblematic.

When switching on, first the semiconductor switching device 50 is switched on, and then the relay 54 with a time delay. When switching off, this is done reversely, with a time delay as well. Thus, both when switching on and when switching off, the relay 54 only switches the residual voltage remaining across the semiconductor switching device 50, or the MOSFETs 52, but commutes almost the entire current due to the low lead-through resistance. Therefore, the switching device 38 is suitable to switch 1000 V with 10 A DC with low power dissipation. Thus, the present disclosure permits to switch on and off a photovoltaic string 10 or parts of the DC generator 2 in a controlled manner, cost-effectively and with optimized installation size.

It will be apparent to a person skilled in the art that the embodiments described above are meant to be exemplary and that the present disclosure is not limited thereto but may be varied in many ways without departing from the scope of the claims. Furthermore, it will be apparent that irrespective of whether disclosed in the description, the claims, the figures, or otherwise, the features individually define components of the present disclosure, even if they are described together with other features.

The invention claimed is:

1. A photovoltaic system, comprising:
at least one photovoltaic string, wherein the at least one photovoltaic string is formed by photovoltaic modules which are series-connected by a string line so as to generate a string voltage;
a switching device which is connected in series in the string line, in order to switch on and off the at least one photovoltaic string using the switching device;
wherein the switching device comprises a hybrid switch including a relay and a semiconductor switching device connected in parallel to the relay wherein the semiconductor switching device includes at least one semiconductor switch; and
a control device to control the hybrid switch, wherein
the control device closes the semiconductor switching device and then, after a time delay for switching on, closes the relay, when switching on the at least one photovoltaic string, and
the control device opens the relay and then, after a time delay for switching off, opens the semiconductor switching device, when switching off the at least one photovoltaic string, and
wherein the at least one semiconductor switch of the semiconductor switching device and the relay are configured as normally open switches, and
wherein the semiconductor switching device is maintained closed during a time period starting when the control device closes the semiconductor switching device and ending when the control device opens the semiconductor switching device after the time delay for switching off.

2. The photovoltaic system of claim 1,
wherein the hybrid switch defines a closed state and an open state, and in the closed state transfers photovoltaically generated current from the at least one photovoltaic string to a current collector, and in the open state interrupts the transfer of photovoltaically generated current from the at least one photovoltaic string; and
wherein the control device is configured to open the hybrid switch in a user-controlled manner in response to a user input.

3. The photovoltaic system of claim 1,
wherein the semiconductor switch is a field effect transistor.

4. The photovoltaic system of claim 2,
wherein the hybrid switch is adapted to interrupt a current flow in both directions in its open state.

5. The photovoltaic system of claim 1,
wherein the hybrid switch comprises a parallel circuit of the relay and two back-to-back connected semiconductor switches.

6. The photovoltaic system of claim 1,
wherein the time delay for switching on and the time delay for switching off are less than or equal to 2000 ms, at least if the photovoltaic string carries a string current corresponding to the rated current.

7. A photovoltaic system, comprising:
at least one photovoltaic string, wherein the at least one photovoltaic string is formed by photovoltaic modules which are series-connected by a string line so as to generate a string voltage;
a switching device which is connected in series in the string line, in order to switch on and off the at least one photovoltaic string using the switching device;
wherein the switching device comprises a hybrid switch including a relay and a semiconductor switching device connected in parallel to the relay wherein the semiconductor switching device includes at least one semiconductor switch; and
a control device to control the hybrid switch, wherein
the control device closes the semiconductor switching device and then, after a time delay, closes the relay, when switching on the at least one photovoltaic string, and
the control device opens the relay and then, after a time delay, opens the semiconductor switching device, when switching off the at least one photovoltaic string,
wherein the switching device comprises the control device and a sensor device connected to the control device for measuring at least one electrical parameter on the associated photovoltaic string, wherein the control device is configured to be responsive to the at least one electrical parameter measured by the sensor device by electrically connecting the associated photovoltaic string to a current collector, said sensor device comprising:
an input voltage sensor measuring a string side input voltage on the switching device; and
an output voltage sensor measuring a current collector side output voltage on the switching device; and
wherein the control device is configured to be responsive to at least one of the measured string side input voltage or the measured current collector side output voltage by electrically connecting the associated photovoltaic string to a central collection point, when release has been accorded by the user.

8. The photovoltaic system of claim 1,
wherein the switching device is adapted for at least one of a DC switching voltage of greater than or equal to 300 V, or a DC lead-through current of greater than or equal to 5 A; and
wherein the hybrid switch produces a power dissipation of less than or equal to 10 W, calculated on the basis of the rated current of the at least one photovoltaic string, when the semiconductor switching device and the relay are closed; and wherein the semiconductor switching device is adapted for a DC switching voltage of greater than or equal to 300 V.

9. The photovoltaic system of claim 3, wherein the semiconductor switches are adapted
for a drain-source voltage ($V_{DS}$) of greater than or equal to 300 V; and
for a drain current ($I_D$) of greater than or equal to 5 A.

10. The photovoltaic system of claim 3,
wherein the semiconductor switches have a drain-source on-resistance of greater than or equal to 100 mOhms; and
wherein the semiconductor switches produce a power dissipation, calculated on the basis of the rated current of the at least one photovoltaic string, of greater than or equal to 2 W, when the one or more field effect transistor(s) are closed and the relay is open.

11. The photovoltaic system of claim 8,
wherein the relay is adapted for at least one of the DC lead-through current of greater than or equal to 5 A, or a DC switching current of less than or equal to 8 A; and
wherein the relay has a maximum AC switching voltage of less than or equal to 800 V.

12. An electronically controlled DC hybrid switching device configured for a DC generator, for switching off at least one string of the DC generator from a current collector,
wherein the DC hybrid switching device comprises
a hybrid switch including a relay and a semiconductor switching device connected in parallel to the relay wherein the semiconductor switching device includes at least one semiconductor switch, and
a control device to control the hybrid switch,
wherein the control device closes the semiconductor switching device and then, after a time delay for switching on, closes the relay, when switching on the at least one string, and the control device opens the relay and then, after a time delay for switching off, opens the semiconductor switching device, when switching off the at least one string, and
wherein the at least one semiconductor switch of the semiconductor switching device and the relay are configured as normally open switches, and
wherein the semiconductor switching device is maintained closed during a time period starting when the control device closes the semiconductor switching device and ending when the control device opens the semiconductor switching device after the time delay for switching off.

13. A method of using a switching device comprising a hybrid switch including a relay and a semiconductor switching device connected in parallel to the relay for switching on and off at least part of a DC generator, which comprises at least one string generating a string voltage, and also comprises the switching device connected in series in a string line in order to switch on and off the at least one string using the switching device, wherein the semiconductor switching device includes at least one semiconductor switch and wherein the at least one semiconductor switch of the semiconductor switching device and the relay are configured as normally open switches, wherein the semiconductor switching device is maintained in a closed state from when the at least one string is switched on until the at least one string is switched off, and wherein the method comprises:
user-controlled triggering of the switching device by a trigger signal in order to disconnect the at least one string from a current collector; and
user-controlled triggering of the switching device by another trigger signal in order to reconnect the at least one string to the current collector.

14. A method for switching off and back on individual strings of a DC generator, which comprises a plurality of strings each generating a string voltage, and also comprises a plurality of switching devices each including a relay and a semiconductor switching device connected in parallel to the relay, wherein each of the switching devices is connected in series to a corresponding string, wherein each of the semiconductor switching devices includes at least one semiconductor switch and wherein the at least one semiconductor switch of the semiconductor switching device and the relay are configured as normally open switches, wherein the semiconductor switching device is maintained in a closed state from when the at least one string is switched on until the at least one string is switched off, and wherein the method comprises:
user-controlled triggering of one of the switching devices by a trigger signal in order to individually disconnect the corresponding string from a current collector; and
user-controlled triggering of the switching device by a trigger signal in order to reconnect the corresponding string to the current collector.

15. The photovoltaic system of claim 7, wherein the switching device further comprises a short-circuiting switch in parallel with the photovoltaic modules of the photovoltaic string to trigger string side short-circuits in the at least one photovoltaic string and to start the photovoltaic modules of the photovoltaic string through an injected starting current.

16. The photovoltaic system of claim 15, wherein the control device controls the short-circuiting switch to inject starting current in the photovoltaic string, whereafter the control device compares the string side input voltage to the current collector side output voltage and, if the string side input voltage is either greater than or equal to the current collector side output voltage or greater than or equal to the current collector side output voltage minus a predetermined threshold, then the control device drives the hybrid switch to be closed so as to connect the photovoltaic string to the current collector.

17. The photovoltaic system of claim 7, wherein the sensor device also comprises at least one current sensor in the photovoltaic string to measure string current in a positive direction away from the photovoltaic modules and toward the current collector and in a negative direction away from the current collector and toward the photovoltaic modules, wherein when the current becomes negative, the control device drives the hybrid switch to open.

18. The photovoltaic system of claim 7, further comprising a string box including a housing enclosing the switching device and the control device, and having a positive pole input configured to be connected to a positive pole of the photovoltaic string, a negative pole input configured to be connected to a negative pole of the photovoltaic string, a positive pole output configured to be connected to a positive pole of the current collector, and a negative pole output configured to be connected to a negative pole of the current collector.

19. The photovoltaic system of claim 18, wherein the hybrid switch generates a calculated power dissipation of less than or equal to 10 W when the semiconductor switching device and the relay are closed.

20. The photovoltaic system of claim 1, wherein the hybrid switch comprises a parallel circuit of the relay and two back-to-back connected MOSFETs.

* * * * *